United States Patent
Chia et al.

(10) Patent No.: US 6,861,343 B2
(45) Date of Patent: Mar. 1, 2005

(54) BUFFER METAL LAYER

(76) Inventors: Chok J. Chia, 10132 Prado Vista Dr., Cupertino, CA (US) 95014; Qwai H. Low, 10225 E. Estate Dr., Cupertino, CA (US) 95014; Ramaswamy Ranganathan, 14711 Vickery Pl., Saratoga, CA (US) 95070

( * ) Notice: Subject to any disclaimer, the term of this patent is extended or adjusted under 35 U.S.C. 154(b) by 30 days.

(21) Appl. No.: 10/267,410

(22) Filed: Oct. 9, 2002

(65) Prior Publication Data

US 2004/0072414 A1 Apr. 15, 2004

(51) Int. Cl.[7] .............................................. H01L 21/44
(52) U.S. Cl. ...................... 438/612; 438/669; 438/121; 257/692; 257/786
(58) Field of Search ................................ 438/612, 121, 438/619, 660, 692, 675, 672, 666, 669; 257/692, 786

(56) References Cited

U.S. PATENT DOCUMENTS

| | | | | |
|---|---|---|---|---|
| 5,336,928 A | * | 8/1994 | Neugebauer et al. | 257/758 |
| 5,534,728 A | * | 7/1996 | Kim et al. | 257/668 |
| 5,888,889 A | * | 3/1999 | Frisina et al. | 438/545 |
| 5,924,006 A | * | 7/1999 | Lur et al. | 438/626 |
| 6,303,423 B1 | * | 10/2001 | Lin | 438/238 |
| 6,380,087 B1 | * | 4/2002 | Gupta et al. | 438/692 |

* cited by examiner

*Primary Examiner*—Caridad Everhart

(57) ABSTRACT

An integrated circuit having a top passivation layer and bonding pads, where the improvement is a metal layer overlying all of the integrated circuit. The metal layer overlies the top passivation layer and is not in electrical contact with any of the bonding pads. In this manner, there is a structure that is added to the integrated circuit which has a relatively high thermal conductivity, and which also has a relatively high structural strength. With these two added properties, the occurrence of stress cracks, such as those induced by plastic molded packages, is reduced, and hot spots tend to be dissipated. Thus, the overlying metal layer tends to improve the reliability of the integrated circuit.

20 Claims, 1 Drawing Sheet

BUFFER METAL LAYER

FIELD

This invention relates to the field of integrated circuit fabrication. More particularly, this invention relates to improving the structural, heat dissipation, and electrical shielding properties of an integrated circuit.

BACKGROUND

Because integrated circuits tend to be extremely sensitive devices, there are a great many constraints that are placed on their designs. These constraints typically fall into one or more general categories such as structural constraints, issues dealing with heat dissipation, and electrical shielding of the integrated circuit. Often, these constraints are interrelated, and may even be conflicting in nature.

For example, in regard to structural constraints, an integrated circuit needs to be protected in a manner where it will not crack. It an integrated circuit cracks, then the various layers tend to not make proper electrical and physical connections one with the other, and the integrated circuit does not function properly. Thus, various methods have been created for packaging the integrated circuit, such as plastic molding.

Unfortunately, every solution tends to produce new issues. In the case of plastic molding, localized formations of thermal energy, or hot spots, tend to occur because the plastic molding is not a good heat conductor. Also, because the plastic molding tends to have a different thermal coefficient of expansion than the other elements of the integrated circuit, there is a tendency for plastic molded integrated circuits to develop stress cracks, such as at the corners of such devices.

As another example, even without the thermal insulating effects of a molded plastic package, integrated circuits tends to develop hot spots in certain locations. This is because the major component of an integrated circuit is the monolithic silicon, or other semiconductor material, substrate on which the integrated circuit is formed. Silicon and other semiconducting materials are relatively poor thermal energy conductors, and thus when a specific portion of an integrated circuit has a relatively heavy duty cycle, the thermal energy that is developed by the electrical activity in that area tends to build up in that area, rather than to dissipate to other areas.

What is needed, therefore, is a system for reducing cracking and increasing thermal energy dissipation in integrated circuits.

SUMMARY

The above and other needs are met by an integrated circuit having a top passivation layer and bonding pads, where the improvement is a metal layer overlying substantially all of the integrated circuit. The metal layer overlies the top passivation layer and is not in electrical contact with any of the bonding pads. In this manner, there is a structure that is added to the integrated circuit which has a relatively high thermal conductivity, and which also has a, relatively high structural strength. With these two added properties, the occurrence of stress cracks, such as those induced by plastic molded packages, is reduced, and hot spots tend to be dissipated. Thus, the overlying metal layer tends to improve the reliability of the integrated circuit.

In various preferred embodiments of the invention, the integrated circuit is formed on a silicon substrate. Preferably, the top passivation layer is formed of a silicon oxide. The metal layer is, in alternate embodiments, preferably formed of aluminum or copper. The metal layer preferably has a thickness that is substantially equal to the thickness of the bonding pads. Most preferably, the metal layer and the bonding pads are formed of substantially the same material. In a most preferred embodiment, the metal layer and the bonding pads are formed with a single deposition reaction.

According to another aspect of the invention, there is described an integrated circuit having a top passivation layer and bonding pads, where the improvement is a metal layer overlying substantially all of the integrated circuit. The metal layer overlies the top passivation layer and is only in electrical contact with ground contacts of the bonding pads. In this manner, there is a structure that is added to the integrated circuit which has a relatively high thermal conductivity, and which also has a relatively high structural strength, the benefits of which are described above. However, with the metal layer grounded to one or more of the bonding pads, the metal layer also provides electromagnetic radiation shielding. Although the metal layer can provide some degree of electromagnetic radiation shielding even when it is not grounded to a bonding pad, grounding the metal layer in this manner tends to enhance the electromagnetic radiation shielding.

According to yet another aspect of the invention, there is provided a method of fabricating an integrated circuit. A passivation layer is formed over the integrated circuit, and voids are etched in the passivation layer. The voids extend through the passivation layer to electrical contacts. Bonding pads are formed on the electrical layer, where the bonding pads extend through the voids and make electrical connections to the electrical contacts. A metal layer is formed on the passivation layer, where the metal layer forms the outermost layer of the integrated circuit. In preferred embodiments, the step of forming the bonding pads and the step of forming the metal layer are accomplished with a single deposition and etch. In one embodiment the step of forming the metal layer includes electrically isolating the metal layer from all of the bonding pads. Alternately, the step of forming the metal layer includes electrically isolating the metal layer from all of the bonding pads except ground contacts of the bonding pads.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
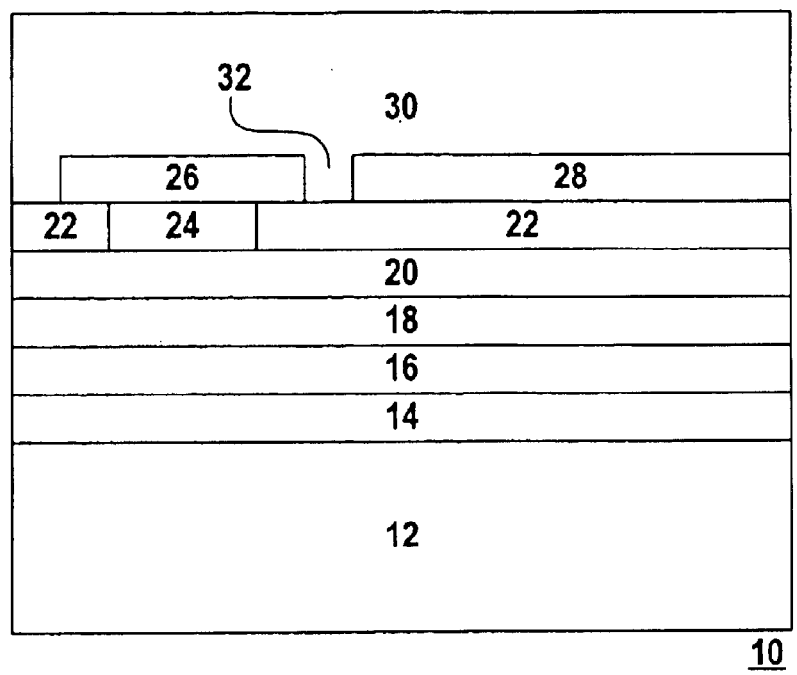
FIG. 1 is a cross sectional view of an integrated circuit, depicting the relationship between the passivation layer, the metal layer, the bonding pads, and the packaging.

With reference now to FIG. 1 there is depicted a cross sectional view of an integrated circuit 10, depicting the relationship between the passivation layer 22, the metal layer 28, the bonding pads 26, and the packaging 30. As depicted in FIG. 1, the integrated circuit 10 is fabricated on a substrate 12, which is most preferably a semiconducting substrate such as germanium, silicon germanium, a III–IV material such as gallium arsenide, or most preferably silicon. Layers 14–16 are built up on the substrate 12 in a manner as known in the art, to form the various structures, elements, and components, both active and passive, of the integrated circuit 10. It is appreciated that in actual implementation, there would tend to be a far greater number of such layers 14–16, and the structures so formed would not all be planar as depicted in FIG. 1. Therefore, the layers 14-16 are representational only, and are not intended to be a limitation on the present invention in any way.

Layer 20 represents an electrically conductive layer, such as a metal layer. Formed on top of the metal layer 20 is the passivation layer 22, which is typically the uppermost layer of an integrated circuit 10. The passivation layer 22 is preferably formed of a silicon oxide based material, such as a glass or silicon dioxide. A void 24 is formed in the passivation layer 22, through which an electrically conductive bonding pad 26 makes electrical connection to the electrically conductive layer 22. Preferably, there are additional electrical connections made to the top surface of the bonding pad 26, such as by wire bonds. However, these electrical connections are not depicted so as to simplify the figures and to focus attention on the relatively more important aspects of the invention.

The bonding pad 26 and the passivation layer 28 are typically the uppermost layers of the monolithic portion of the integrated circuit 10. On top of the bonding pad 26 there is formed an encapsulant 30, such as a molded plastic package, such as may be part of a dual in line molded plastic package, or some other similar molded plastic package. As mentioned above, the plastic 30 tends to have a relatively low thermal conductivity, and also tends to have a thermal coefficient of expansion that is significantly different from the thermal coefficient of expansion of the integrated circuit 10. Thus, as the integrated circuit 10 produces thermal energy, the plastic 30 tends to keep the thermal energy within relatively small areas of the package because of the low thermal conductivity of the plastic 30. Thus, the thermal energy is expressed as localized hot spots, which heat the area in which they are formed.

Because the thermal coefficients of expansion for the plastic 30 and the integrated circuit 10 are different, the plastic 30 and the integrated circuit 10 expand at different rates in response to the localized heating, which tends to cause the integrated circuit 10 to crack. Thus, the integrated circuit 10 is exposed to both cracking and heat damage.

To reduce these problems, the present Invention provides for an additional metal layer 28 to be formed on the top surface of the passivation layer 22, over substantially all of the integrated circuit 10, meaning almost all of the integrated circuit 10 except for the bonding pads 26. The metal layer 28 provides a variety of valuable functions. For example, the metal layer 28 is a relatively good conductor of thermal energy, especially as compared to the plastic 30 or the passivation layer 22. Therefore, as localized thermal energy is created by the electronic activity within a small position of the integrated circuit 10, the metal layer 2S tends to dissipate the thermal energy across the entire surface of the integrated circuit 10, enabling a more uniform heating of both the integrated circuit 10 and the plastic 30. This tends to further reduce the degree to which any portion of the integrated circuit 10 and the plastic 30 heals, because the thermal energy is spread out across a larger area. This also improves heat dissipation from the packaged integrated circuit.

Further, because the metal layer 28 is relative thick, tough, and durable, and therefore not given to cracking, it tends to protect the underlying integrated circuit 10 from any stresses that may still be set up between the plastic 30 and the integrated circuit 10 due to the differences in the thermal coefficients of expansion of the plastic 30 and the integrated circuit 10. Thus, the additional metal layer 28 is of great benefit to the overall reliability of the integrated circuit 10.

Figure 2:
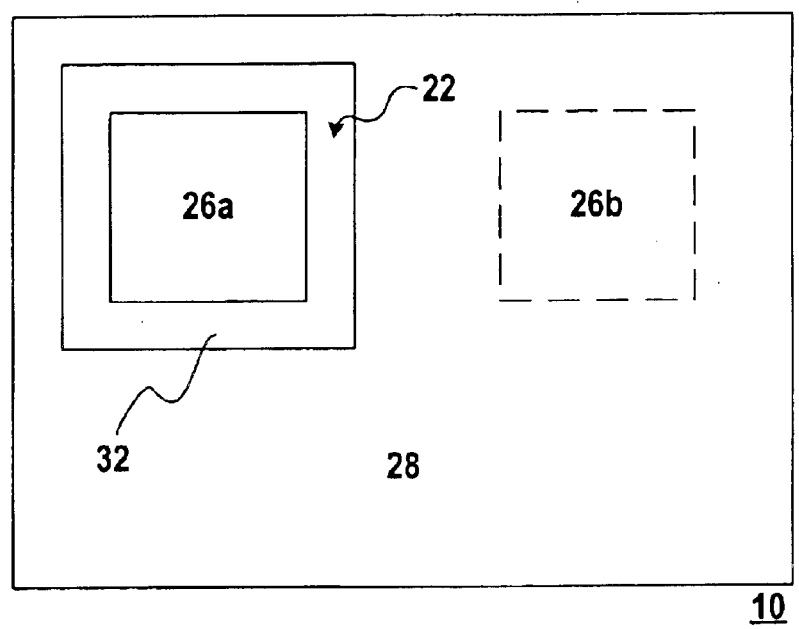
FIG. 2 is a top plan view of the integrated circuit, depicting the relationship between the passivation layer, the metal layer, and the bonding pads.

As depicted in FIG. 2, bonding pad 26a is not electrically connected to the metal layer 28, but rather there is a gap 32 between the bonding pad 26a and the metal layer 28. Thus, the metal layer 28 does not short out all of the bonding pads 26. However, the metal layer 28 may, in one embodiment, make contact with portions of the integrated circuit 10 which would otherwise be defined as a bonding pad, such as portions 26b, depicted in phantom because it is a logical bonding pad and not physically separate from the metal layer 28.

The logical bonding pad 26b is preferably a ground contact, which is in electrical connection with the metal layer 28, and other metal layers below the passivation layer 22. In other words, the logical bonding pad 26b would look just like the regular bonding pad 26, if the metal layer 28 did not exist, and an electrical connection such as a wire bond is still preferably made to the logical bonding pad 26b.

In this manner, the entire metal layer 28 acts as a ground plane. Thus, the grounded metal layer 28 helps reduce electromagnetic radiation from interfering with the operation of the integrated circuit 10. It is appreciated, however, that the metal layer 28 need not be grounded to any of the ground contacts 26b in order to provide some degree of electromagnetic radiation shielding.

The metal layer 28 is preferably formed by a metal deposition process such as sputtering or evaporation, but can also be formed in a chemical vapor deposition reaction or plating process. Preferably the metal layer 28 is formed of aluminum or copper, but may be formed of other metals, or another material with good mechanical and thermal energy conduction properties. Most preferably, the metal layer 28 is formed of the same material, and to the same thickness, and at the same time as the bonding pads 26. The bonding pads 26a which are not to be electrically connected to the metal layer 28 are then further defined in a subsequent masking and etching process. In a most preferred embodiment the metal layer 28 is between about five thousand angstroms thick and about fifty thousand angstroms thick, and most preferably about twenty thousand angstroms thick.

Thus, the metal layer 28 as described above provides structural benefits to the integrated circuit 10. In addition, the metal layer 28 provides heat spreading and dissipation benefits, and electromagnetic radiation shielding.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit having an uppermost passivation layer and bonding pads, the improvement comprising a metal layer overlying substantially all of the integrated circuit, the metal layer overlying the uppermost passivation layer, the metal layer and the bonding pads disposed on a common layer of the integrated circuit, and the metal layer not in electrical contact with any of the bonding pads.

2. The integrated circuit of claim 1, wherein the integrated circuit is formed on a silicon substrate.

3. The integrated circuit of claim 1, wherein the uppermost passivation layer is formed of a silicon oxide.

4. The integrated circuit of claim 1, wherein the metal layer is formed of aluminum.

5. The integrated circuit of claim 1, wherein the metal layer is formed of copper.

6. The integrated circuit of claim 1, wherein the metal layer has a thickness and the bonding pads have a thickness, and the thickness of the metal layer is substantially equal to the thickness of the bonding pads.

7. The integrated circuit of claim 1, wherein the metal layer and the bonding pads are formed of substantially the same material.

8. The integrated circuit of claim 1, wherein the metal layer and the bonding pads are formed with a single deposition reaction.

9. In an integrated circuit having an uppermost passivation layer and bonding pads, the improvement comprising a metal layer overlying substantially all of the integrated circuit, the metal layer overlying the uppermost passivation layer, and the metal layer only in electrical contact with ground contacts of the bonding pads.

10. The integrated circuit of claim 9, wherein the integrated circuit is formed on a silicon substrate.

11. The integrated circuit of claim 9, wherein the uppermost passivation layer is formed of a silicon oxide.

12. The integrated circuit of claim 9, wherein the metal layer is formed of aluminum.

13. The integrated circuit of claim 9, wherein the metal layer is formed of copper.

14. The integrated circuit of claim 9, wherein the metal layer has a thickness and the bonding pads have a thickness, and the thickness of the metal layer is substantially equal to the thickness of the bonding pads.

15. The integrated circuit of claim 9, wherein the metal layer and the bonding pads are formed of substantially the same material.

16. The integrated circuit of claim 9, wherein the metal layer and the bonding pads are formed with a single deposition reaction.

17. In a method of fabricating an integrated circuit, the improvement comprising the steps of:

forming an uppermost passivation layer, etching voids in the uppermost passivation layer, which voids extend through the uppermost passivation layer to electrical contacts, forming bonding pads on the uppermost passivation layer, which bonding pads extend through the voids the make electrical connections to the electrical contacts, and forming a metal layer on the uppermost passivation layer, the metal layer overlying substantially all of the integrated circuit the metal layer forming the outermost layer of the integrated circuit.

18. The method of claim 17, wherein the step of forming the bonding pads and the step of forming the metal layer are accomplished with a single deposition and etch.

19. The method of claim 17, wherein the step of forming the metal layer comprises electrically isolating the metal layer from all of the bonding pads.

20. The method of claim 17, wherein the step of forming the metal layer comprises electrically isolating the metal layer from all of the bonding pads except ground contacts of the bonding pads.

* * * * *